(12) United States Patent
Okabe et al.

(10) Patent No.: US 8,246,764 B2
(45) Date of Patent: Aug. 21, 2012

(54) COPPER ALLOY SPUTTERING TARGET AND SEMICONDUCTOR ELEMENT WIRING

(75) Inventors: Takeo Okabe, Ibaraki (JP); Hirohito Miyashita, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 32 days.

(21) Appl. No.: 12/367,572

(22) Filed: Feb. 9, 2009

(65) Prior Publication Data

US 2009/0139863 A1 Jun. 4, 2009

Related U.S. Application Data

(62) Division of application No. 10/530,438, filed as application No. PCT/JP03/13251 on Oct. 16, 2003, now Pat. No. 7,507,304.

(30) Foreign Application Priority Data

Nov. 21, 2002 (JP) .................................. 2002-337341

(51) Int. Cl.
*C23C 14/00* (2006.01)
(52) U.S. Cl. .......................... 148/433; 420/470; 420/471
(58) Field of Classification Search .................. 148/433; 420/470, 471
See application file for complete search history.

(56) References Cited

U.S. PATENT DOCUMENTS

| | | | |
|---|---|---|---|
| 3,760,146 A * | 9/1973 | Rozet ........................ 219/146.52 |
| 4,224,087 A * | 9/1980 | Tachikawa et al. ............. 148/98 |
| 4,822,560 A | 4/1989 | Oyama et al. |
| 5,023,698 A | 6/1991 | Kobayashi et al. |
| 5,853,505 A * | 12/1998 | Brauer et al. ................. 148/433 |
| 6,113,761 A * | 9/2000 | Kardokus et al. ........ 204/298.13 |
| 6,143,427 A | 11/2000 | Andler |
| 6,391,163 B1 | 5/2002 | Pavate et al. |
| 6,451,135 B1 | 9/2002 | Takahashi et al. |
| 6,482,302 B1 * | 11/2002 | Li et al. ..................... 204/298.13 |
| 2002/0024142 A1 | 2/2002 | Sekiguchi |
| 2004/0004288 A1 | 1/2004 | Sekiguchi |
| 2005/0121320 A1 | 6/2005 | Okabe et al. |
| 2006/0088436 A1 | 4/2006 | Okabe |
| 2007/0051624 A1 | 3/2007 | Okabe et al. |
| 2007/0209547 A1 | 9/2007 | Irumata et al. |

FOREIGN PATENT DOCUMENTS

| | | |
|---|---|---|
| EP | 0601509 A1 | 6/1994 |
| EP | 1026284 A1 | 8/2000 |
| JP | 49-023127 A | 3/1974 |
| JP | 61-231131 A | 10/1986 |
| JP | 63-065039 A | 3/1988 |
| JP | 05-311424 A | 11/1993 |
| JP | 10-060633 A | 3/1998 |
| JP | 10-330927 A | 12/1998 |
| JP | 11-158614 A | 6/1999 |
| JP | 2000-087158 A | 3/2000 |
| JP | 2000208517 * | 7/2000 |
| JP | 2000-239836 A | 9/2000 |
| JP | 2001-284358 A | 10/2001 |
| JP | 2002038246 * | 2/2002 |
| JP | 2002-294437 A | 10/2002 |
| JP | 2002-294438 A | 10/2002 |
| WO | 03/064722 A1 | 8/2003 |

OTHER PUBLICATIONS

One Page English Language Abstract of JP 01-096374 A, Apr. 14, 1989.
One page English Language Abstract of JP 01-180976 A, Jul. 18, 1989.
One page English Language Abstract of JP 02-119140 A, May 7, 1990.
One page English Language Abstract of JP 02-050432 A, Feb. 20, 1990.
One page English Language Abstract of JP 2862727 B2, Mar. 3, 1999.
One page English Language Abstract of JP 11-186273 A, Jul. 9, 1999.
One page English Language Abstract of JP 06-140398 A, May 20, 1994.

* cited by examiner

*Primary Examiner* — Sikyin Ip
(74) *Attorney, Agent, or Firm* — Howson & Howson LLP

(57) ABSTRACT

A first copper alloy sputtering target comprising 0.5 to 4.0 wt % of Al and 0.5 wtppm or less of Si and a second copper alloy sputtering target comprising 0.5 to 4.0 wt % of Sn and 0.5 wtppm or less of Mn are disclosed. The first and/or the second alloy sputtering target can further comprise one or more elements selected from among Sb, Zr, Ti, Cr, Ag, Au, Cd, In and As in a total amount of 1.0 wtppm or less. A semiconductor element wiring formed by the use of the above targets is also disclosed. The above copper alloy sputtering target allows the formation of a wiring material for a semiconductor element, in particular, a seed layer being stable, uniform and free from the occurrence of coagulation during electrolytic copper plating and exhibits excellent sputtering film formation characteristics.

14 Claims, No Drawings

COPPER ALLOY SPUTTERING TARGET AND SEMICONDUCTOR ELEMENT WIRING

CROSS REFERENCE TO RELATED APPLICATIONS

This application is a divisional of U.S. application Ser. No. 10/530,438, now U.S. Pat. No. 7,507,304, which is the National Stage of International Application No. PCT/JP03/13251, filed Oct. 16, 2003, which claims the benefit under 35 USC §119 of Japanese Application No. 2002-337341, filed Nov. 21, 2002.

BACKGROUND OF THE INVENTION

The present invention pertains to a copper alloy sputtering target for a wiring material of a semiconductor element, in particular a copper alloy sputtering target which allows the formation of a seed layer being stable, uniform and free from the occurrence of coagulation during copper electroplating and which exhibits excellent sputtering film formation characteristics, and a semiconductor element wiring formed with such a target.

Conventionally, Al (specific resistance of roughly 3.1 $\mu\Omega\cdot$cm) has been used as the wiring material of a semiconductor element, but copper wiring with lower resistance (specific resistance of roughly 1.7 $\mu\Omega\cdot$cm) has been put into practical application pursuant to the miniaturization of wiring.

With the current formation process of copper wiring, often times, after forming a diffusion barrier layer of Ta/TaN or the like in a contact hole or the concave portion of a wiring groove, copper is electroplated thereto. In order to perform this electroplating, as the foundation layer (seed layer), generally, copper or copper alloy is sputtered and deposited thereto.

Ordinarily, electrolytic copper having a purity of 4N (excluding gas components) is employed as the crude metal in a wet or dry high purification process to manufacture high purity copper having a purity of 5N to 6N, and this was used as the sputtering target. Here, there was no particular problem for copper wirings having a semiconductor wiring width of up to 0.18 $\mu$m.

Nevertheless, there were problems in that with ultra fine wiring where the copper wiring width is 0.13 $\mu$m or less; for instance, 90 nm or 65 nm, and the aspect ratio exceeds 8, the thickness of the seed layer would become an ultra thin film of 100 nm or less, and, when forming a seed layer with a 6N purity copper target, coagulation would occur and a favorable seed layer could not be formed.

As described above, the uniformity of the foundation layer is important, and, when the foundation layer becomes coagulated, it is not possible to form a uniform film upon forming a copper film via electroplating. For example, during wiring, defects such as voids, hillocks, and disconnections are formed.

Even if defects such as voids described above are not formed, since an uneven electrodeposited texture of copper will be formed in this portion, there is a problem in that the electromigration resistance will deteriorate.

In order to overcome this problem, it is important to form a stable and uniform seed layer upon performing copper electroplating, and a sputtering target optimal in forming a seed layer having superior sputter deposition characteristics is required.

Heretofore, as the copper wiring material, a method has been proposed of adding certain elements to copper in order to improve the electromigration (EM) resistance, corrosion resistance, bond strength and so on (for example, c.f. Japanese Patent Laid-Open Publication No. H5-311424, Japanese Patent Laid-Open Publication No. H1-248538). Further, also proposed is a pure copper target or a target in which 0.04 to 0.15 wt % of Ti is added thereto.

And, in the foregoing proposals, rapid cooling for the uniform dispersion of the added elements, or continuous casting for preventing the segregation of added elements in ingots, cracks during casting, and coarsening of ingots are being proposed.

Nevertheless, although high purity copper or copper alloy which add minute amounts of metal to the high purity copper have an advantage in that the specific resistance is low, these cannot necessarily be considered favorable materials since there is the problem of electromigration and the problem of oxidation resistance during the process.

In particular, since the aspect ratio is becoming even higher in recent years (aspect ratio of 4 or higher), sufficient electromigration resistance and oxidation resistance are being sought.

In light of the above, as a wiring material, a proposal has been made for adding Al or Sn (or other various elements such as Ti or Zr) to copper to obtain a copper alloy to be used as the target (for example, c.f. Japanese Patent Laid-Open Publication No. H10-060633). Nevertheless, this is for improving the EM resistance, SM resistance or oxidation resistance without hindering the low resistance characteristics of copper, and could not be used for forming a seed layer in an ultra fine copper wiring process pursuant to the copper electroplating described above (for example, c.f. Japanese Patent Laid-Open Publication No. H6-177117).

Further, there is also a proposal stating that 0.5 wt % of Sn is effective in reducing the grain boundary diffusion and improving the EM characteristics of Cu (for example, c.f. [Electromigration and diffusion in pure Cu and Cu(Sn) alloy, Mat. Res. Soc. Symp. Proc. Vol. 427, 1996], Materials Research Society, written by C. H. Hu, K. L. Lee, D. GupTa, and P. Blauner (IBM)). Nevertheless, this does not resolve the coagulation problem (interaction) with the seed layer on the barrier layer formed with the likes of Ta or TaN.

Accordingly, with conventional technology, a wiring material for a semiconductor element, in particular, a copper alloy which allows the formation of a seed layer being stable, uniform and free from the occurrence of coagulation during copper electroplating has not been obtained, and conventionally technology was not necessarily sufficient.

SUMMARY OF THE INVENTION

An object of the present invention is to provide a wiring material for a semiconductor element, in particular a copper alloy sputtering target which allows the formation of a seed layer being stable, uniform and free from the occurrence of coagulation during copper electroplating, and exhibits excellent sputtering film formation characteristics, and a semiconductor element wiring formed with such a target.

In order to achieve the foregoing object, as a result of intense study, the present inventors discovered that the addition of an appropriate amount of metal elements will prevent the generation of defects such as voids, hillocks, and disconnections during copper electroplating, and realize a copper alloy sputtering target capable of forming a stable and uniform seed layer having a low specific resistance and favorable electromigration resistance and oxidation resistance, and a semiconductor element wiring formed with such a target.

Based on the foregoing discovery, the present invention provides a copper alloy sputtering target containing 0.5 to 4.0 wt % of Al and 0.5 wtppm or less of Si. The copper alloy sputtering target may contain one or more elements selected from among Sb, Zr, Ti, Cr, Ag, Au, Cd, In and As in a total amount of 1.0 wtppm or less, or more preferably, 0.5 wtppm or less.

The present invention also provides a copper alloy sputtering target containing 0.5 to 4.0 wt % of Sn and 0.5 wtppm or less of Mn. The copper alloy sputtering target may contain one or more elements selected from among Sb, Zr, Ti, Cr, Ag, Au, Cd, In and As in a total amount of 1.0 wtppm or less, or more preferably, 0.5 wtppm or less.

The above referenced copper alloy sputtering targets can have a recrystallization temperature of 365° C. or less and an oxygen content of 5 wtppm or less, or more preferably, 1 wtppm or less. The copper alloy sputtering targets can also have an average crystal grain size of 0.1 to 60 μm and an average grain size variation within 20%. In addition, the copper alloy sputtering targets can have a total amount of Al and Sn contained therein of 0.5 to 4.0 wt %.

The present invention is also directed to semiconductor element wiring formed with the above referenced copper alloy sputtering targets. Preferably, the semiconductor element wiring is formed as a semiconductor wiring seed layer, and the seed layer is formed on a barrier film of Ta, Ta alloy or the nitrides thereof.

DETAILED DESCRIPTION OF THE INVENTION

The copper alloy sputtering target of the present invention contains 0.5 to 4.0 wt % of Al and 0.5 wtppm or less of Si, and, in particular, is capable of forming a stable and uniform seed layer without any coagulation and superior in oxidation resistance upon performing copper electroplating. Further, this is superior in sputter deposition characteristics and useful as the wiring material of a semiconductor element.

As a result of containing 0.5 to 4.0 wt % of Al, this alloy is able to effectively prevent coagulation upon plating. In other words, the wettability with the barrier film is improved.

If the Al content is less than 0.5 wt %, coagulation cannot be prevented, and, if it exceeds 4.0 wt %, resistance at the seed layer will increase, and the resistance of the overall copper wiring will increase, which is not preferable. Further, during melting in the copper alloy manufacturing process, since the oxygen content will increase together with the increase of Al, it is necessary to avoid such Al content from exceeding 4.0 wt %. Particularly, it is optimal that the Al content is 1 to 2 wt %.

The inclusion of Si will improve the oxidation resistance. Nevertheless, Si itself has no effect of preventing coagulation, and, since it will deteriorate the coagulation prevention effect of Al when the content exceeds 0.5 wtppm, it is necessary to keep the Si content 0.5 wtppm or less. In particular, since Si will be mixed from Al of the melting material, control of the Si component is important.

The copper alloy sputtering target of the present invention may contain one or more selected from among Sb, Zr, Ti, Cr, Ag, Au, Cd, In and As in a total amount of 1.0 wtppm or less.

These constituent elements will improve the oxidation resistance. Nevertheless, as with Si, if the content exceeds 1.0 wtppm, they will significantly deteriorate the coagulation prevention effect of Al; that is, since they will significantly deteriorate the wettability with the barrier film, it is necessary to keep the content 1.0 wtppm or less when adding such constituent elements. In particular, a preferable additive amount is in a total amount of 0.5 wtppm or less.

Moreover, the copper alloy sputtering target of the present invention contains 0.5 to 4.0 wt % of Sn and 0.5 wtppm or less of Mn, and, in particular, is capable of forming stable and uniform seed layer without any coagulation and superior in oxidation resistance upon performing copper electroplating. Further, this is superior in sputter deposition characteristics and useful as the wiring material of a semiconductor element.

As a result of containing 0.5 to 4.0 wt % of Sn, this alloy is able to effectively prevent coagulation upon plating. In other words, the wettability with the barrier film is improved.

If the Sn content is less than 0.5 wt %, coagulation cannot be prevented, and, if it exceeds 4.0 wt %, resistance at the seed layer will increase, and the resistance as the overall copper wiring will increase, which is not preferable. Further, during melting in the copper alloy manufacturing process, since the deformation processing of the ingot will become difficult, it is necessary to avoid such Sn content from exceeding 4.0 wt %. Particularly, it is optimal that the Sn content is 1 to 3 wt %.

The inclusion of Mn will improve the oxidation resistance. Nevertheless, Mn itself has no effect of preventing coagulation, and, since it will deteriorate the coagulation prevention effect of Sn when the content exceeds 0.5 wtppm, it is necessary to keep the Mn content 0.5 wtppm or less. In particular, since Mn will be mixed from Sn as the melting material, management of the Mn component is important.

The copper alloy sputtering target of the present invention may contain one or more selected from among Sb, Zr, Ti, Cr, Ag, Au, Cd, In and As in a total amount of 1.0 wtppm or less.

These constituent elements will improve the oxidation resistance. Nevertheless, as with Mn, if the content exceeds 1.0 wtppm, since they will significantly deteriorate the coagulation prevention effect of Sn; that is, since they will significantly deteriorate the wettability with the barrier film, it is necessary to keep the content 1.0 wtppm or less when adding such constituent elements. In particular, a preferable range is in a total amount of 0.5 wtppm or less.

With the copper alloy sputtering target of the present invention, it is desirable that the recrystallization temperature is 365° C. or less. When the recrystallization temperature exceeds 365° C., coagulation will occur easier since the temperature for securing the thermal stability of the plating film will become higher. In other words, there is a defect in that the interaction (wettability) with the barrier layer will deteriorate.

Incidentally, this recrystallization temperature represents the temperature located at the intermediate Hv value between the Hv of the fully annealed material and the Hv prior to annealing (after 70% cold working) upon fully annealing a sample at 800° C., subjecting this to 70% cold working, retaining this for 30 minutes at 100 to 600° C., and measuring the Vickers hardness (MicroVickers, load of 100 g).

Further, with the copper alloy sputtering target of the present invention, it is desirable that oxygen is 5 wtppm or less, more desirably 1 wtppm or less. Although oxygen will work to miniaturize the target texture, it will also form inclusions in the grain boundary and cause the generation of particles. In particular, since there is a problem in that oxygen will generate emergent particles during the sputtering life, it is desirable to reduce the oxygen content as much as possible.

Moreover, if copper oxide ($Cu_2O$) is formed on the seed layer, there is a problem in that such portion may dissolve upon electroplating. When the surface of the seed layer is affected by the plating bath as described above, there is a problem in that the electric field will fluctuate at a micro level, and a uniform plated film cannot be formed. Therefore, it is necessary to limit the oxygen content within the foregoing range.

Further, with the copper alloy sputtering target of the present invention, it is desirable that the average crystal grain size is 0.1 to 60 μm, and the variation of the average grain size is within ±20%.

As described above, by controlling the target texture, uniformity of the film (evenness of the film thickness) can be improved throughout the sputtering target life, and the uniformity of the film composition can be improved. In particular, when the wafer size exceeds 300 mm, the film uniformity will become more important.

Further, with the copper alloy sputtering target of the present invention, Al and Sn can be contained in a total amount of 0.5 to 4.0 wt %. The additive amount of the respective components is the same as the foregoing example.

Moreover, the copper alloy sputtering target of the present invention is useful in the manufacture of semiconductor element wiring, in particular to the formation of a seed layer for semiconductor wiring, and also optimal for the formation of a seed layer on the barrier film of Ta, Ta alloy or nitrides thereof.

The copper alloy sputtering target of the present invention, for example, may be manufactured with the following process.

Foremost, high purity copper having a purity of 6N or higher, high purity Al and Sn having the same level of purity, and other additive elements are adjusted, and dissolved in a high vacuum atmosphere with the cold crucible melting method employing a water-cooled copper crucible to obtain a high purity alloy. The amount of additive elements must be managed sufficiently. Upon melting, in order to reduce the contamination caused by the contact with molten metal, it is effective to establish a copper plate having a purity of 6N at the bottom of the crucible.

The alloyed molten metal is promptly cast in a water-cooled copper mold in a high vacuum atmosphere to obtain an ingot. As a result of controlling the texture of this ingot; for instance, by controlling the crystal grain size, sputtering characteristics can be improved.

The surface layer is removed from the manufactured ingot, and the ingot is subject to hot forging, hot rolling, cold rolling and heat treatment so as to form a target material. This target material is further subject to machine processing to form a prescribed shape, and bonded with a backing plate to form a target product.

EXAMPLES AND COMPARATIVE EXAMPLES

The present invention is now explained in detail with reference to the Examples and Comparative Examples. These Examples are merely illustrative, and the present invention shall in no way be limited thereby. In other words, the present invention shall only be limited by the scope of claim for a patent, and shall include the various modifications other than the Examples of this invention.

Examples 1-10

High purity copper having a purity of 6N or higher, high purity AL, Sn, Mn having the same level of purity, and other additive elements were adjusted, and dissolved in a high vacuum atmosphere with the cold crucible melting method employing a water-cooled copper crucible to obtain a high purity alloy. The adjusted alloy compositions of Examples 1-10 are shown in Table 1 regarding Cu-Al alloys, and in Table 2 regarding Cu-Sn alloys.

Incidentally, Example 5 and Example 10 are cases where alloy elements Sb, Zr, Ti, Cr, Ag, Au, Cd, In and As were not added. Therefore, the amounts shown in Table 1 and Table 2 are contained in the impurity level.

Upon melting, in order to reduce the contamination caused by the contact with molten metal, a copper plate having a purity of 6N was set at the bottom of the crucible. The alloyed molten metal was cast in a water-cooled copper mold in a high vacuum atmosphere to obtain an ingot.

Next, the surface layer of the manufactured ingot was removed to make the ingot $\phi 160 \times 60t$, and thereafter made to $\phi 200$ by hot forging at 400° C. Thereafter, this was hot rolled at 400° C. and rolled until $\phi 270 \times 20t$, and further cold rolled until $\phi 360 \times 10t$.

Next, after performing heat treatment thereto at 500° C. for 1 hour, the overall target was rapidly cooled to form a target material. This was subject to machine processing to obtain a target having a diameter of 13 inches and a thickness of 7 mm, and further diffusion bonded with an Al alloy backing plate to obtain a sputtering target assembly.

Measurement of the average grain size was conducted with the method of section based on JIS H0501, wherein 17 points were given concentrically in the planar direction, and 3 points on the front face, center and back face in the plate thickness direction to measure the target with a total of 17×3=51 points.

The target obtained pursuant to the above was used to form a sputtered film having a thickness of 50 nm on an 8-inch TaN/Ta/Si substrate. The degree of coagulation of this sputtered film was observed with a high resolution SEM. Moreover, the uniformity of the film sputtered and deposited to a thickness of roughly 500 nm on the Si substrate was measured.

Regarding the foregoing results, in addition to the component and composition of the target, the oxygen content, recrystallization temperature, average crystal grain size, variation of sputtered film, coagulation property, and uniformity of film thickness (3σ(%)) are shown in Table 1 and Table 2.

In the present invention, the oxygen content is low, and the recrystallization temperature is also low. Further, the average crystal grain size is 60 μm or less, and the variation of the average grain size is within ±20%.

And, coagulation is suppressed, and coagulation did not occur at all or the coagulation property was extremely low. Further, it is evident that obtained is a copper alloy sputtering target superior in the film thickness uniformity, and capable of forming a stable and uniform seed layer. As a result, this target can be used to obtain a superior semiconductor element wiring.

TABLE 1

| Cu—Al alloys | Composition | Si (ppm) | Mn (ppm) | *Total (ppm) | O (ppm) | Recrystallization Temperature (° C.) | Average Grain Size (μm) | Variation (%) | Coagulation Property | Uniformity of Film Thickness (3σ (%)) |
|---|---|---|---|---|---|---|---|---|---|---|
| Example 1 | 0.64 wt % Al | 0.19 | — | 0.44 | <1 | 285 | 41 | 13 | ◯ | 9 |
| Example 2 | 1.0 wt % Al | 0.21 | — | 0.32 | <1 | 300 | 39 | 9 | ◎ | 16 |
| Example 3 | 2.0 wt % Al | 0.33 | — | 0.36 | 5 | 335 | 31 | 11 | ◎ | 9 |
| Example 4 | 4.0 wt % Al | 0.41 | — | 0.24 | 5 | 355 | 19 | 7 | ◯ | 9 |
| Example 5 | 2.0 wt % Al | — | — | <0.01 | <1 | 330 | 40 | 13 | ◎ | 18 |
| Comparative Example 1 | 0.106 wt % Al | 0.09 | — | 0.16 | <1 | 260 | 85 | 16 | X | 20 |

TABLE 1-continued

| Cu—Al alloys | Composition | Si (ppm) | Mn (ppm) | *Total (ppm) | O (ppm) | Recrystallization Temperature (° C.) | Average Grain Size (μm) | Variation (%) | Coagulation Property | Uniformity of Film Thickness (3σ (%)) |
|---|---|---|---|---|---|---|---|---|---|---|
| Comparative Example 2 | 0.21 wt % Al | 0.11 | — | 0.32 | <1 | 285 | 46 | 13 | X | 12 |
| Comparative Example 3 | 0.43 wt % Al | 0.19 | — | 0.32 | <1 | 280 | 61 | 16 | Δ | 18 |
| Comparative Example 4 | 9.6 wt % Al | 1.82 | — | 0.86 | 5 | 375 | 18 | 5 | X | 7 |
| Comparative Example 5 | 1.0 wt % Al | 0.84 | — | 0.35 | <1 | 290 | 47 | 14 | Δ | 14 |
| Comparative Example 6 | 1.0 wt % Al | 0.78 | — | 0.81 | <1 | 290 | 52 | 16 | Δ | 15 |
| Comparative Example 7 | 1.0 wt % Al | 0.19 | — | 0.41 | 15 | 340 | 32 | 8 | Δ | 14 |
| Comparative Example 8 | 1.0 wt % Al | 0.23 | — | 0.36 | 25 | 380 | 26 | 8 | X | 11 |
| Comparative Example 9 | 1.0 wt % Al | 0.17 | — | 0.32 | <1 | 300 | 72 | 110 | ◎ | 27 |
| Comparative Example 10 | 1.0 wt % Al | 0.17 | — | 0.32 | <1 | 300 | 256 | 60 | ◎ | 25 |

TABLE 2

| Cu—Sn alloys | Composition | Si (ppm) | Mn (ppm) | *Total (ppm) | O (ppm) | Recrystallization Temperature (° C.) | Average Grain Size (μm) | Variation (%) | Coagulation Property | Uniformity of Film Thickness (3σ (%)) |
|---|---|---|---|---|---|---|---|---|---|---|
| Example 6 | 2.7 wt % Sn | — | 0.15 | 0.22 | <1 | 335 | 39 | 13 | ◎ | 8 |
| Example 7 | 0.93 wt % Sn | — | 0.20 | 0.28 | <1 | 325 | 42 | 15 | ○ | 13 |
| Example 8 | 3.67 wt % Sn | — | 0.20 | 0.35 | <1 | 365 | 34 | 16 | ◎ | 14 |
| Example 9 | 4.0 wt % Sn | — | 0.35 | 0.33 | 5 | 365 | 29 | 9 | ◎ | 16 |
| Example 10 | 3.67 wt % Sn | — | — | <0.01 | <1 | 365 | 52 | 18 | ◎ | 18 |
| Comparative Example 11 | 0.1 wt % Sn | — | 0.10 | 0.16 | <1 | 320 | 61 | 18 | X | 11 |
| Comparative Example 12 | 10 wt % Sn | — | 0.85 | 0.36 | 10 | 390 | 26 | 15 | X | 9 |
| Comparative Example 13 | 2.7 wt % Sn | — | 1.23 | 0.22 | <1 | 335 | 42 | 16 | ○ | 11 |
| Comparative Example 14 | 2.7 wt % Sn | — | 0.82 | 0.81 | <1 | 335 | 46 | 13 | Δ | 7 |
| Comparative Example 15 | 2.7 wt % Sn | — | 0.15 | 0.26 | <1 | 335 | 120 | 163 | ◎ | 36 |
| Comparative Example 16 | 2.7 wt % Sn | — | 0.10 | 0.25 | <1 | 335 | 311 | 82 | ◎ | 24 |

Comparative Examples 1-16

Under the same manufacturing conditions as with Examples 1-10, materials of similar alloy components but outside the scope of the present invention were used to manufacture a copper alloy target in a case of changing the alloy component, and a case of changing the grain size and variation thereof, respectively.

These conditions are similarly shown in Table 1 regarding Cu—Al alloys and shown in Table 2 regarding Cu—Sn alloys. The target obtained pursuant to the above was used to form a sputtered film having a thickness of 50 nm on an 8-inch TaN/Ta/Si substrate.

The degree of coagulation of this sputtered film was observed with a high resolution SEM. Moreover, the uniformity of the film sputtered and deposited to a thickness of roughly 500 nm on the Si substrate was measured.

Regarding the foregoing results of Comparative Examples 1-16, in addition to the component and composition of the target, the oxygen content, recrystallization temperature, average crystal grain size, variation of sputtered film, coagulation property, and uniformity of film thickness (3σ(%)) are shown in Table 1 and Table 2.

In each of the Comparative Examples 1-3, Al is less than 0.5 wt %, and the coagulation prevention effect is low. In Comparative Example 4, Al exceeds 4.0 wt %, and, Si also increased, the recrystallization temperature is high, and the coagulation prevention effect is low. Further, as shown in Comparative Example 5, when Si increases (exceeds 0.5 ppm), the coagulation prevention effect will deteriorate.

In Comparative Example 6, since Si also increased (exceeded 0.5 ppm), the coagulation prevention effect deteriorated.

In Comparative Example 7, the oxygen content is high, and the coagulation prevention effect is low. In Comparative Example 8, the oxygen content is high and the recrystallization temperature is also high, but the coagulation prevention effect became worse.

In Comparative Example 9, the variation of the grain size is significant, and the uniformity of the film thickness is inferior. In Comparative Example 10, the grain size is large, and the uniformity of the film thickness is similarly inferior.

In Comparative Example 11, the Sn content is less than 0.5 wt %, and the coagulation prevention effect is low. Contrarily, in Comparative Example 12, the Sn content exceeds 4.0 wt %, and, Mn also increased, the recrystallization temperature is also high, and the coagulation prevention effect is inferior. As shown in Comparative Example 13, when the Mn content increases, the coagulation prevention effect will deteriorate.

In Comparative Example 14, since the Mn content is similarly high, the coagulation prevention effect has deteriorated.

Further, in Comparative Example 15, the variation of the grain size is significant, and the uniformity of the film thickness is inferior. In Comparative Example 16, the grain size is large, and the uniformity of the film thickness is similarly inferior.

Comparative Examples 17-25

Under the same manufacturing conditions as with Examples 1-10, a copper alloy target was manufactured with pure copper or a copper alloy material other than the present invention (using a conventional copper material), respectively. The conditions are shown in Table 3.

The target obtained pursuant to the above was used to form a sputtered film having a thickness of 50 nm on an 8-inch TaN/Ta/Si substrate. The degree of coagulation of this sputtered film was observed with a high resolution SEM. Moreover, the uniformity of the film sputtered and deposited to a thickness of roughly 500 nm on the Si substrate was measured.

Regarding the foregoing results of Comparative Examples 17-25, in addition to the component and composition of the target, the oxygen content, recrystallization temperature, average crystal grain size, variation of sputtered film, coagulation property, and uniformity of film thickness ($3\sigma(\%)$) are shown in Table 3. As evident from Table 3, conventional pure copper or copper alloy resulted in an inferior coagulation prevention effect.

acteristics, and a semiconductor element wiring formed with such a target.

The invention claimed is:

1. A copper alloy sputtering target for forming a seed layer of semiconductor wiring, comprising a sputtering target made of a copper alloy consisting of 0.5 to 4.0 wt % of Sn, 0.15 to 0.5 wtppm of Mn, and copper, and having an average crystal grain size of 0.1 to 60 μm, and an average grain size variation of within ±20%.

2. A copper alloy sputtering target according to claim 1, wherein said copper alloy sputtering target has a recrystallized structure and a recrystallization temperature of 365° C. or less.

3. A copper alloy sputtering target according to claim 1, wherein said copper alloy contains 0.15 to 0.35 wtppm of Mn.

4. A copper alloy sputtering target according to claim 1, wherein said copper alloy contains 0.15, 0.20 or 0.35 wtppm of Mn.

5. A copper alloy sputtering target according to claim 1, wherein said copper alloy contains 1 to 3 wt % of Sn.

6. A copper alloy sputtering target consisting of copper, 0.5 to 4.0 wt % of Sn, 5 wtppm or less of oxygen, and an amount of Mn of 0.15 to 0.5 wtppm to improve oxidation resistance, and said copper alloy sputtering target being for forming a seed layer of semiconductor wiring and having an average crystal grain size of 0.1 to 60 μm and an average grain size variation of within ±20%.

7. A copper alloy sputtering target according to claim 6, wherein said copper alloy sputtering target contains 1 wtppm or less of oxygen.

8. A copper alloy sputtering target according to claim 6, wherein said copper alloy sputtering target has a recrystallized structure and a recrystallization temperature of 365° C. or less.

TABLE 3

| Pure Copper, Other Copper alloy | Composition | Si (ppm) | Mn (ppm) | *Total (ppm) | O (ppm) | Recrystallization Temperature (° C.) | Average Grain Size (μm) | Variation (%) | Coagulation Property | Uniformity of Film Thickness ($3\sigma$ (%)) |
|---|---|---|---|---|---|---|---|---|---|---|
| Comparative Example 17 | 5N Pure Copper | 1.6 | — | 3.23 | 10 | 145 | 42 | 16 | X | 13 |
| Comparative Example 18 | 6N Pure Copper | 0.06 | — | 0.33 | <1 | 145 | 48 | 18 | X | 14 |
| Comparative Example 19 | 7N Pure Copper | 0.04 | — | <0.1 | <1 | 140 | 85 | 35 | Δ | 21 |
| Comparative Example 20 | 8N Pure Copper | — | — | <0.01 | <1 | 140 | 112 | 40 | Δ | 22 |
| Comparative Example 21 | 1.0 wt % Ti | 0.12 | — | 0.18 | <1 | 495 | 19 | 9 | X | 13 |
| Comparative Example 22 | 1.0 wt % Mg | 0.18 | — | 0.56 | <1 | 300 | 31 | 15 | Δ | 15 |
| Comparative Example 23 | 1.0 wt % Si | — | — | 0.29 | <1 | 310 | 26 | 16 | X | 12 |
| Comparative Example 24 | 1.0 wt % Zr | 0.13 | — | 0.18 | <1 | 550 | 35 | 19 | X | 16 |
| Comparative Example 25 | 1.0 wt % Ni | 0.16 | — | 0.23 | <1 | 250 | 29 | 14 | Δ | 11 |

Note:
—: below detection limit
*Sb, Zr, Ti, Cr, Ag, Au, Cd, In, As
Note:
Coagulation Property: not coagulated (◎) → Strongly Coagulated (X)

The present invention yields a superior effect in that it is able to provide a copper alloy sputtering target which allows the formation of a wiring material for a semiconductor element, in particular, a seed layer being stable, uniform and free from the occurrence of coagulation during electrolytic copper plating and exhibits excellent sputtering film formation char- 9. A copper alloy sputtering target according to claim 6, wherein said copper is high purity copper having a purity of 6N (99.9999%) or higher.

10. A copper alloy sputtering target consisting of copper, 0.5 to 4.0 wt % of Sn, 5 wtppm or less of oxygen, one or more elements selected from the group consisting of Zr, Ti, Cr, Ag, Au, Cd, In and As in a total amount of 1.0 wtppm or less, and an amount of Mn of 0.15 to 0.5 wtppm to improve oxidation resistance, and said copper alloy sputtering target being for forming a seed layer of semiconductor wiring and having an average crystal grain size of 0.1 to 60 μm and an average grain size variation of within ±20%.

11. A copper alloy sputtering target according to claim 10, wherein said copper alloy sputtering target contains 1 wtppm or less of oxygen.

12. A copper alloy sputtering target according to claim 10, wherein said copper alloy sputtering target has a recrystallized structure and a recrystallization temperature of 365° C. or less.

13. A copper alloy sputtering target according to claim 10, wherein said copper is high purity copper having a purity of 6N (99.9999%) or higher.

14. A copper alloy sputtering target consisting of copper, Sn and Al with a total amount of Sn and Al being 0.5 to 4.0 wt %, one or more elements selected from the group consisting of Zr, Ti, Cr, Ag, Au, Cd, In and As in a total amount of 1.0 wtppm or less, and an amount of Mn of 0.15 to 0.5 wtppm, and said copper alloy sputtering target being for forming a seed layer of semiconductor wiring and having an average crystal grain size of 0.1 to 60 μm and an average grain size variation of within ±20%.

\* \* \* \* \*